United States Patent
Hui et al.

(10) Patent No.: US 6,369,416 B1
(45) Date of Patent: Apr. 9, 2002

(54) SEMICONDUCTOR DEVICE WITH CONTACTS HAVING A SLOPED PROFILE

(75) Inventors: Angela T. Hui, Fremont; Tuan Duc Pham, Santa Clara; Mark T. Ramsbey, Sunnyvale; Yu Sun, Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/404,394

(22) Filed: Sep. 23, 1999

(51) Int. Cl.[7] ............................................. H01L 29/76
(52) U.S. Cl. .................. 257/288; 257/296; 257/306; 257/315; 257/368; 257/390
(58) Field of Search ................... 257/288, 368, 257/369, 296, 306, 307, 308, 309, 310, 390, 315

(56) References Cited

U.S. PATENT DOCUMENTS 5,739,563 A * 4/1998 Kawakubo et al. ......... 257/295
6,171,970 B1 * 1/2001 Xing et al. ................. 438/706
6,177,351 B1 * 1/2001 Beratan et al. ............. 438/694

FOREIGN PATENT DOCUMENTS

JP           07297297        * 11/1995

* cited by examiner

Primary Examiner—Nathan Flynn
Assistant Examiner—Remmon R. Fordé
(74) Attorney, Agent, or Firm—Sawyer Law Group LLP

(57) ABSTRACT

A method and system for providing a contact in a semiconductor device including a plurality of gates is disclosed. The method and system include providing an insulating layer substantially surrounding at least a portion of the plurality of gates and providing at least one contact within the insulating layer. The contact has a side defining a sloped profile. The sloped profile includes an angle between the side of the contact and a surface of the substrate that is less than approximately eighty-eight degrees.

4 Claims, 4 Drawing Sheets

SEMICONDUCTOR DEVICE WITH CONTACTS HAVING A SLOPED PROFILE

FIELD OF THE INVENTION

The present invention relates to semiconductor devices, more particularly to a method and system for reducing charge gain and charge loss due to contacts in semiconductor devices, such as a flash memory device.

BACKGROUND OF THE INVENTION

A conventional semiconductor device, such as a memory, includes a large number of cells, which are typically floating gate devices such as floating gate transistors. For example, FIG. 1 depicts a portion of a conventional semiconductor device 10. The semiconductor device 10 includes cells 20, 30, and 40 formed on a substrate 11. Each cell includes a gate stack 21, 31 and 41. Each gate stack 21, 31 and 41 includes a floating gate 22, 32 and 42, respectively, and a control gate 24, 34 and 44, respectively. The cells 20, 30 and 40 also include drains 29 and 39 and sources 19 and 49. As depicted in FIG. 1, the cells 20 and 40 share a common drain 29, while the cells 20 and 30 share a common source 19. Typically, each cell 20, 30 and 40 also includes spacers 26 and 28, 36 and 38, and 46 and 48, respectively.

In order to make electrical contact to one or more of the cells 20, 30 and 40, a conventional electrical contact 52 is provided. The conventional contact 52 is provided within a conventional contact hole 50. The conventional contact hole 50 is provided in an insulating layer 54 which otherwise covers the cells 20, 30 and 40. The insulating layer 54 insulates the cells 20, 30 and 40. The conventional contact hole 50 is filled with a conductive material to form the conventional contact 52.

Although the conventional semiconductor device 10 functions, one of ordinary skill in the art will readily realize that the conventional semiconductor device 10 is subject to unanticipated charge gain and charge loss because of the spacing of the contact 52 from a particular cell, such as the cell 20. The current trend in semiconductor technology is toward higher densities. In order to reduce the space occupied by a given conventional semiconductor device 10, the components of the semiconductor device are more densely packed and made smaller. Thus, the cells 20, 30 and 40 and the conventional contact 52 are relatively close. The thickness of the spacers 26 and 28, 36 and 38 and 46 and 48 is between approximately one thousand and two thousand Angstroms. The conventional contact 52 is approximately 0.2 to 0.4 $\mu$m wide. This distance is approximately the smallest that an aperture in a photoresist mask (not shown) can be made. The photoresist mask is used to form the conventional contact hole 50. The sides of the conventional contact hole 50 and, therefore, the sides of the conventional contact 52 are also almost perpendicular to the surface of the substrate 11. For example, the conventional contact hole 50 is typically formed so that the edges make an angle, $\beta$, of greater than eighty-eight degrees. Thus, the top of the contact 52 is approximately directly above the bottom of the contact 52. The conventional contact 52 is also closely spaced to neighboring cells 20, 30 and 40. In particular, the distance between the base of the conventional contact 52 and the edge of a nearest gate in a gate stack, such as the gate stack 21, is very small.

The small spacing between the conventional contact 52 and the gate stack of a particular cell, such as the cell 20, causes unanticipated charge gain and charge loss from the cell 20. Because the conventional contact 52 is typically separated from the edge of the gate stack 21 by such a small distance, the portion of the insulating layer 54 between the conventional contact 52 and the gate stack 21 is very thin. The combination of the spacer 28 and the insulating layer 54 may not provide sufficient insulation to prevent the gate stack 32 from being electrically coupled to the conventional contact 52 through the spacer 28 and insulating layer 54. For example, charge on the conventional contact 52 may travel to the gate stack 21 when a user does not desire the floating gate 22 to store charge. Similarly, a charge stored on the floating gate 22 may travel to the conventional contact 52. Thus, a charge intentionally stored on the floating gate 22 may bleed away. Consequently, the cell 20 is subject to unanticipated charge gain and charge loss. As a result, the cell 20 may not function as desired.

Accordingly, what is needed is a system and method for providing contacts in a semiconductor device which has reduced charge gain and charge loss. The present invention addresses such a need.

SUMMARY OF THE INVENTION

The present invention provides a method and system for providing a contact in a semiconductor device including a plurality of gates. The method and system comprise providing an insulating layer substantially surrounding at least a portion of the plurality of gates and providing at least one contact in the insulating layer. The at least one contact has a side defining a sloped profile. The sloped profile includes an angle between the side of the contact and a surface of the substrate that is less than approximately eighty-eight degrees.

According to the system and method disclosed herein, the present invention provides a greater spacing between the contact and the closest gate stack without increasing the spacing between gate stacks or between the center of the contact and the gate stack. Consequently, a higher density of devices can be achieved while reducing the charge gain and charge loss through the contact.

DETAILED DESCRIPTION OF THE INVENTION

Figure 1:
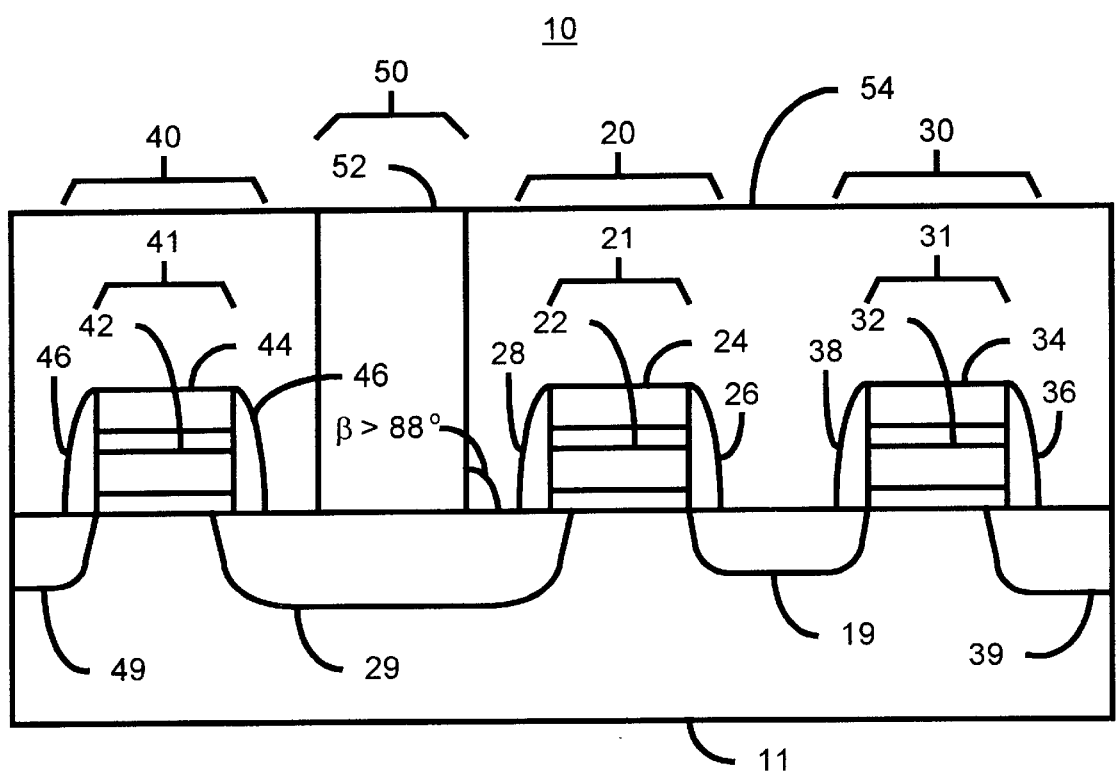
FIG. 1 is a diagram of a conventional semiconductor device

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

A conventional semiconductor device, such as a flash memory, includes a large number of cells, which are typically floating gate devices such as floating gate transistors. The cells also include sources and drains. Typically, each cell also includes spacers. In order to make electrical contact to the source or drain of one or more of the cells, a conventional contact hole is filled with a conductive material to provide a conventional contact. The conventional contact hole is provided in a conventional insulating layer that may otherwise cover and insulate the cells.

Although the conventional semiconductor device functions, one of ordinary skill in the art will readily realize that the conventional semiconductor device is subject to unanticipated charge gain and charge loss because of the spacing of the contact and a nearest cell. The cells and contacts of a conventional semiconductor device are relatively close. In particular, the distance between the base of the conventional contact and the edge of nearest gates of a gate stack is very small. The small spacing between the conventional contact and the gate stack causes undesirable charge gain and charge loss from the cell. Because the conventional contact is typically separated from the edge of the nearest gate stack by such a small distance, the portion of the insulating layer and any spacer between the conventional contact may allow charge stored on the cell to travel to the contact, thereby bleeding away. For similar reasons, a charge on the contact may travel to the nearest cell. Consequently, the cell is subject to unanticipated charge gain and charge loss. As a result, the semiconductor device may malfunction, which is undesirable.

The present invention provides a method and system for providing a contact in a semiconductor device including a plurality of gates. The method and system comprise providing an insulating layer substantially surrounding at least a portion of the plurality of gates and providing at least one contact within the insulating layer. The at least one contact has a side defining a sloped profile. The sloped profile includes an angle between the side of the contact and a surface of the substrate that is less than approximately eighty-eight degrees.

The present invention will be described in terms of a particular device having certain components and particular techniques, such as a plasma etch, for performing certain steps. However, one of ordinary skill in the art will readily recognize that this method and system will operate effectively for other devices having other components and other techniques. Furthermore, the present invention will be described in terms of a particular semiconductor memory device. However, nothing prevents the method and system from being utilized with another semiconductor device.

Figure 2:
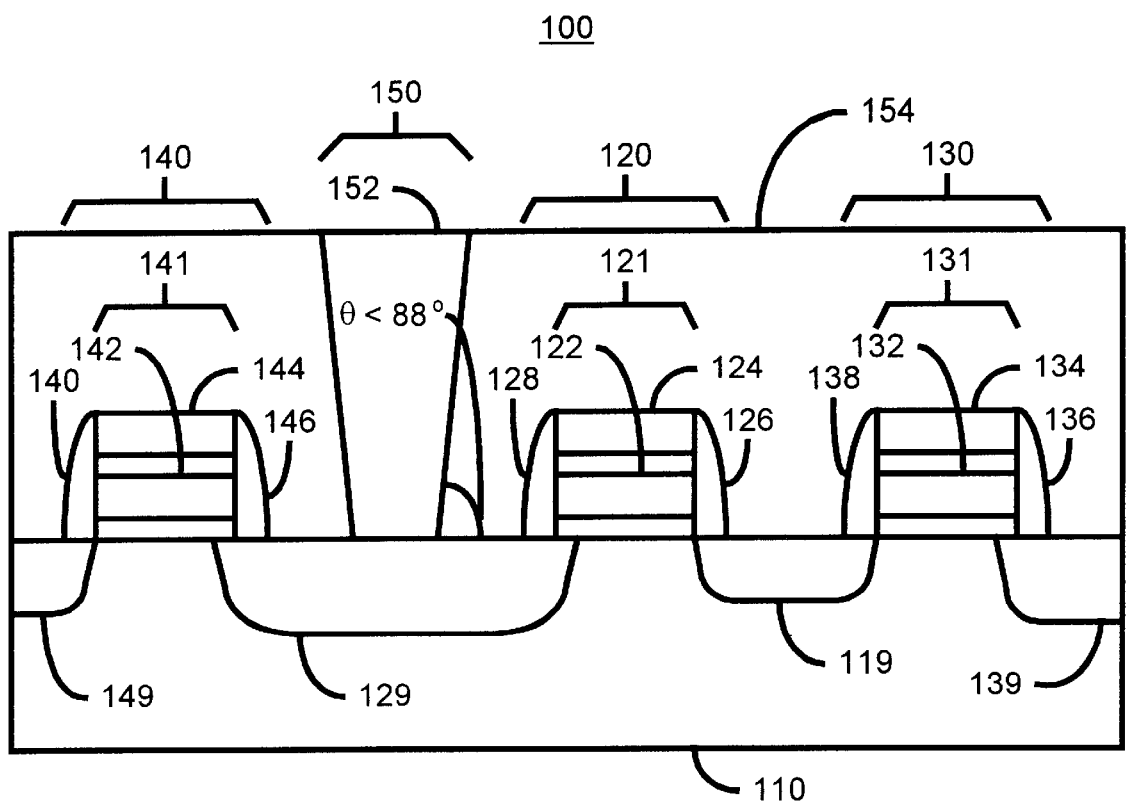
FIG. 2 is a diagram of a one embodiment of a semiconductor device including a contact in accordance with the present invention.

To more particularly illustrate the method and system in accordance with the present invention, refer now to FIG. 2, depicting one embodiment of a semiconductor device 100, such as a memory, for providing a semiconductor device including a contact in accordance with the present invention. The semiconductor device 100 includes a number of cells 120, 130 and 140, which are typically floating gate devices such as floating gate transistors. Each cell 120, 130 and 140 includes a gate stack 121, 131 and 141. Each gate stack 121, 131 and 141 includes a floating gate 122, 132 and 142, respectively, and a control gate 124, 134 and 144, respectively. The cells 120, 130 and 140 also include drains 129 and 139 and sources 119 and 149. The cells 120 and 140 are depicted as sharing a common drain 129, while the cells 120 and 130 are depicted as sharing a common source 119. Typically, each cell 120, 130 and 140 also includes spacers 126 and 128, 136 and 138, and 146 and 148, respectively. Preferably, the spacers 126, 128, 136, 138, 146 and 148 are approximately one thousand to two thousand Angstroms thick.

In order to make electrical contact to one or more of the cells 120, 130 and 140, an electrical contact 152 in accordance with the present invention is used. The electrical contact 152 is provided within a contact hole 150 in accordance with the present invention. The contact hole 150 is provided in an insulating layer 154 which otherwise covers the cells 120, 130 and 140. The insulating layer 154 insulates the cells 120, 130 and 140. The contact hole 150 is filled with a conductive material to form the contact 152.

The contact hole 150 and, therefore, the contact 152 have sides having a sloped profile. Thus, the base of the contact hole 150 and the contact 152 is smaller than the top of the contact hole 150 and the contact 152, respectively. Thus, the contact 152 is a tapered contact. In a preferred embodiment, the angle, θ, between the surface of the substrate 110 underlying the contact 152 and the sides of the contact hole 150 and contact 152 is between eighty-two and eighty eight degrees. Thus, the distance between the base of the contact hole and the nearest gate stack, such as the gate stack 121 is increased. However, the top of the contact hole 150 and, therefore, the top of the contact 152 may still be approximately 0.2–0.4 μm wide. As a result, a conventional photoresist structure (not shown) may be used to provide the contact hole 150. However, the bottom of the contact hole 150 and the bottom of the contact 150 are smaller than 0.2–0.4 μm wide. Thus, the top edge of the contact hole 150 may be a smaller horizontal distance from the closest edge of the nearest gate stack 121 than the bottom edge of the contact hole 150. Similarly, the top edge of the contact 152 may be a smaller horizontal distance from the closest edge of the nearest gate stack 121 than the base of the contact 152. In a preferred embodiment, the top side of the contact hole 150 or contact 152 is approximately the same distance from the closest edge of the gate stack 121, measured horizontally, as the conventional contact hole 50 or contact 52 depicted in FIG. 1. Referring back to FIG. 2, as discussed above, even if the top of the contact hole 150 or contact 152 is no farther from the gate stack 121, the bottom of the contact hole 150 or contact 152 is farther from the gate stack 121. Note, however, that nothing prevents the top edge of the contact hole 150 or contact 152 from being another distance from the closest edge of the gate stack 121.

Because the profile of the sides of the contact 152 are sloped, the edge of the contact 152 is separated from the edge of the nearest gate stack 121 by a greater distance. Because the edge of the contact 150 is a greater distance from the edge of the gate stack 121, there is more of the insulating layer 154 between the contact 152 and the edge of the gate stack 121. As a result, the insulating layer 154 is better able to electrically insulate the contact 152 from the edge of the gate stack 121. In a preferred embodiment, there is sufficient insulation to electrically insulate the contact 152 from the gate stack 121. Consequently, charge intentionally stored by the memory cell 120, for example on the floating gate 122, is much less likely to travel through the insulating layer 154 to the contact 152. Similarly, charge on the contact 152 is much less likely to travel through the insulating layer to the gate stack 121. As a result, unwanted charge gain and charge loss may be reduced or eliminated in a semiconductor device which has components relatively densely packed.

Figure 3A:
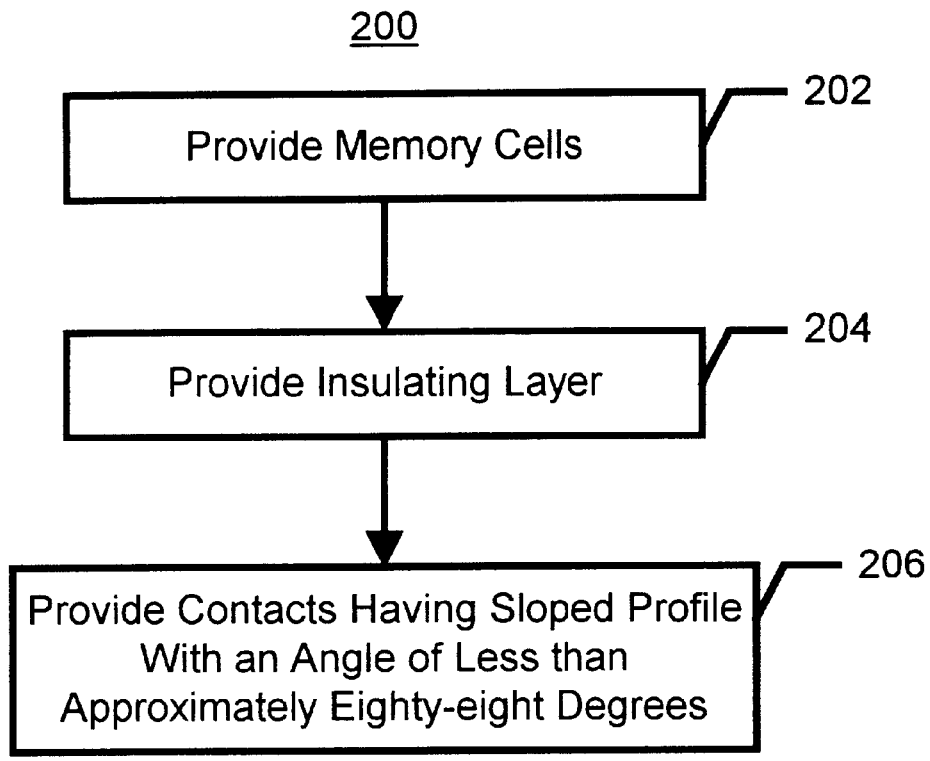
FIG. 3A is a flow chart depicting one embodiment of a method for providing a contact for a semiconductor device in accordance with the present invention.

FIG. 3A depicts one embodiment of a method 200 for providing a semiconductor device in accordance with the present invention. The memory cells 120, 130 and 140 are provided, via step 202. In a preferred embodiment, step 202 includes at least providing the gate stacks 121, 131, and 141. Step 202 may also include providing the spacers 126, 128, 136, 138, 146, and 148. The insulating layer 154 is then provided on the gate stacks, via step 204. The contact 152 having a sloped profile is then provided, via step 206. The sloped profile has an angle with the underlying substrate of less than eighty-eight degrees.

Figure 3B:
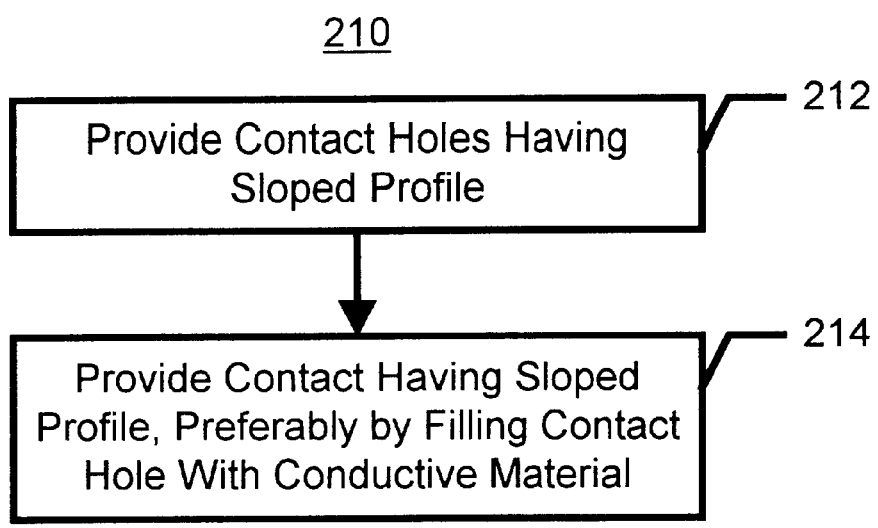
FIG. 3B is a flow chart depicting one embodiment of a method for providing the contact in accordance with the present invention.

FIG. 3B depicts a flow chart of one embodiment of a method 210 in accordance with the present invention for performing step 206, providing the contact 152. One or more contact holes, such as the contact hole 150, are provided, via step 212. Thus, step 206 includes providing contact holes 150 which have a sloped profile. The contact 152 is provided by filling the contact hole 150 with a conductive material, via step 214. Thus, the contact 152 having a sloped profile is formed.

Figure 3C:
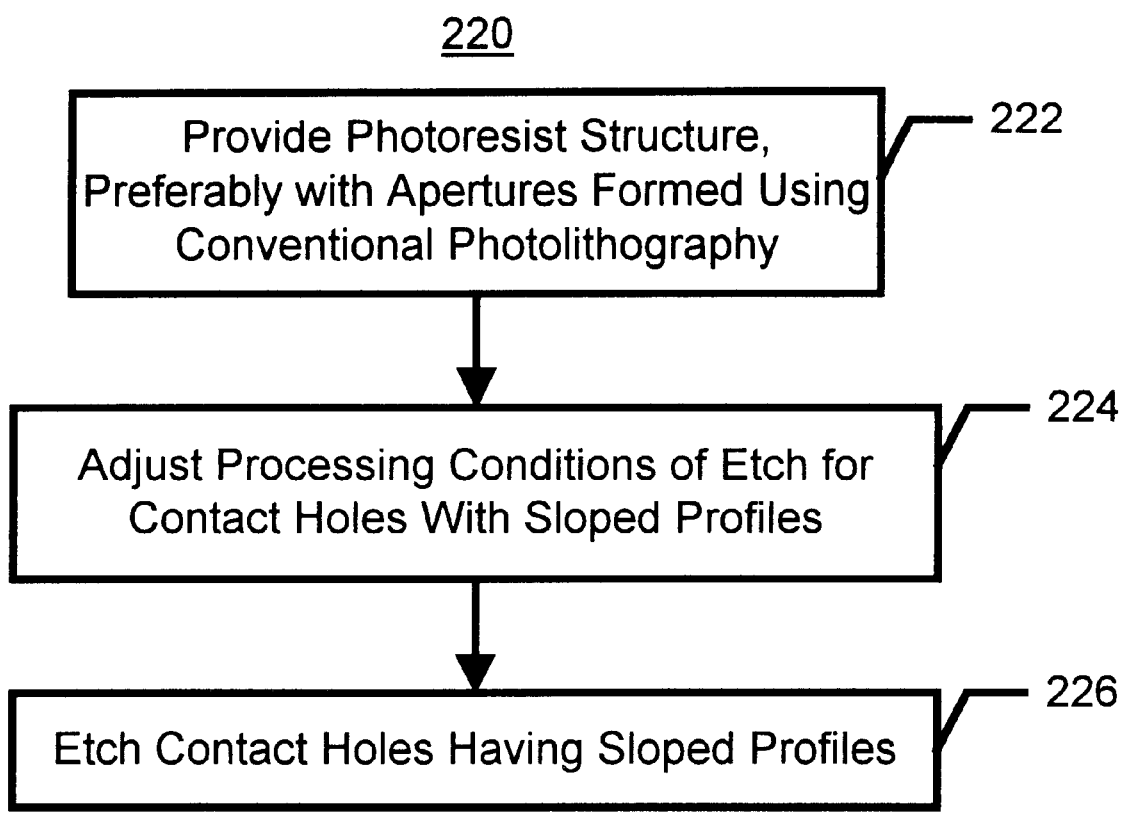
FIG. 3C is a flow chart depicting one embodiment of a method for providing the contact hole in accordance with the present invention.

FIG. 3C depicts one embodiment of a method 220 for performing the step 212 of providing the contact hole(s). A resist structure having apertures above the desired positions of the contact holes is provided, via step 222. In a preferred embodiment, the apertures in the resist structure are approximately the same size as the desired size of the top of the contact hole 150. The processing conditions are then adjusted to ensure that the contact hole 150 has a sloped profile, via step 224. In a preferred embodiment, step 224 is performed by ensuring that the etch of the insulating layer has a more polymerizing chemistry. Preferably, step 224 includes increasing the ratios of $CH_3F$ gas to $CF_4$ gas or $CHF_3$ gas to $CF_4$ gas. The etch for the contact hole 150 is then performed, via step 226. The etch performed in step 226 is preferably a plasma etch.

In the method 220, the etch itself insures that the contact 152 will be tapered, having a sloped profile. As a result, a conventional resist structure may be provided in step 222. The photolithography used in step 222 to form the resist structure may thus be relatively simple to carry out. Furthermore, the etch conditions may be relatively easily controlled once the appropriate ratios of $CH_3F$ gas to $CF_4$ gas or $CHF_3$ gas to $CF_4$ gas are determined. Consequently, the contact 152, and contact hole 150, may be relatively easy to provide. At the same time, a greater distance separates the contact 150 from a nearest gate stack 121. Thus, the charge gain and charge loss issues of the conventional semiconductor device of FIG. 1 may be reduced or eliminated without significantly complicating processing of the semiconductor device 100, depicted in FIG. 2.

A method and system has been disclosed for providing a contact having a sloped profile. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:
    a plurality of gate stacks;
    an insulating layer substantially surrounding at least a portion of the plurality of gates; and
    at least one contact disposed within the insulating layer, the at least one contact having a side defining a sloped profile including an angle between the side of the at least on contact and a surface of a substrate, the angle being less than approximately eighty-eight degrees.

2. The semiconductor device of claim 1 further comprising:
    at least one contact hole within the insulating layer, the at least one contact hole having a second side defining a sloped profile including a second angle between the second side of the contact and the surface of a substrate, the second angle being substantially the same as the first angle; and
    wherein the at least one contact further includes a conductive material filling the at least one contact hole to form at least one contact.

3. The semiconductor device of claim 2 wherein the angle is between eighty-two and eighty eight-degrees.

4. The semiconductor device of claim 2 wherein the at least one contact includes a bottom edge and a top edge and wherein a first distance between the bottom of the at least one contact and a nearest gate of the plurality of gates is greater than a second distance between the top edge of the at least one contact and the at least one contact.

* * * * *